(12) United States Patent
Chiu et al.

(10) Patent No.: US 8,497,832 B2
(45) Date of Patent: Jul. 30, 2013

(54) SHIFT REGISTER WITH IMAGE RETENTION RELEASE AND METHOD FOR IMAGE RETENTION RELEASE

(75) Inventors: Chen-Lun Chiu, Taoyuan County (TW); Hao-Chieh Lee, Taoyuan County (TW); Yi-Suei Liao, Kaohsiung (TW); Chien-Liang Chen, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 867 days.

(21) Appl. No.: 12/643,963

(22) Filed: Dec. 21, 2009

(65) Prior Publication Data
US 2011/0102310 A1    May 5, 2011

(30) Foreign Application Priority Data

Oct. 30, 2009    (TW) ................................ 98136904 A (51) Int. Cl.
*G09G 3/36*    (2006.01)
(52) U.S. Cl.
USPC ............................................ 345/100; 377/64

(58) Field of Classification Search
USPC ....................................... 345/100; 377/64–81
See application file for complete search history.

(56) References Cited

U.S. PATENT DOCUMENTS

| 4,017,741 | A | 4/1977 | Briggs |
| 7,106,292 | B2 | 9/2006 | Moon |
| 7,778,379 | B2 * | 8/2010 | Liao et al. ........................ 377/64 |
| 2007/0035505 | A1 * | 2/2007 | Lin et al. ......................... 345/100 |
| 2007/0296681 | A1 * | 12/2007 | Kim et al. ....................... 345/100 |
| 2008/0001904 | A1 * | 1/2008 | Kim et al. ....................... 345/100 |
| 2010/0182227 | A1 * | 7/2010 | Tsou ............................... 345/100 |
| 2010/0272228 | A1 * | 10/2010 | Hsiao et al. ..................... 377/79 |

* cited by examiner

*Primary Examiner* — Latanya Bibbins
(74) *Attorney, Agent, or Firm* — Jianq Chyun IP Office (57) ABSTRACT

A flat panel display, a shift register with image retention release and method for releasing image retention are provided. An output end of the shift register couples to a gate line of a display panel. A first end of a first transistor couples to the output end of the shift register. A second end of the first transistor couples to a system voltage VDD or a reference voltage VSS. A first end of a capacitor couples to a control end of the first transistor. A second end of the capacitor couples to the reference voltage VSS. During a power-off period, the reference voltage VSS is pulled high for turning on the first transistor, therefore the voltage of the gate line is pulled high.

26 Claims, 8 Drawing Sheets

SHIFT REGISTER WITH IMAGE RETENTION RELEASE AND METHOD FOR IMAGE RETENTION RELEASE

CROSS-REFERENCE TO RELATED APPLICATION

This application claims the priority benefit of Taiwan application serial no. 98136904, filed on Oct. 30, 2009. The entirety of the above-mentioned patent application is hereby incorporated by reference herein and made a part of specification.

BACKGROUND OF THE INVENTION

1. Field of the Invention

The invention relates to a display, and more particularly, to a shift register for releasing an image retention and a method for releasing the image retention.

2. Description of Related Art

In the widely used technique of the thin film transistor (TFT) liquid crystal display (LCD) is to apply the shift register made of amorphous silicon on the gate driver and the source driver of the display panel. The thin film transistor technique has the advantages of low cost of integrated circuit, simple manufacturing process in module stage, and high glass substrate usage. While the liquid crystal display displays images, the storage capacitors in the thin film transistors are used to maintain to pixel voltage. Therefore, when the pixel voltage is not discharged during the power off period, the image retention happens. Conventionally, before the display panel is turned off, the gate drivers pulls up the voltages of the gate lines of the display panel from the negative voltage to a high voltage level so as to simultaneously turn on the thin film transistors of all pixels. Therefore, the voltage of each of the pixels can be effectively discharged before the display panel is turned off so that the problem of the image retention can be avoided. However, by using the shift register made of amorphous silicon, the structure of the conventional shift register cannot support the step for pulling up the voltages of the gate lines from the lower voltage level to the higher voltage level during the power-off period. Therefore, the problem of the image retention happens and is one of the major problems of the amorphous silicon shift register.

SUMMARY OF THE INVENTION

The present invention provides a flat display having a shift register series capable of releasing an image retention. The shift register series can be operated with a proper signal to turn on all of gate lines during the power-off period. Therefore, the problem of the image retention of the shift register can be solved.

The invention provides a method for releasing image retention of a display panel capable of turning on all of gate lines to overcome the problem of the image retention.

One embodiment of the invention provides a flat panel display including a display panel, a power supply circuit, a shift register series, first transistors and a capacitor. The display panel has a plurality of gate lines. The power supply circuit has a system voltage end and a reference voltage end, wherein the power supply circuit pulls up a voltage of the reference voltage end during a power-off period. The shift register series is powered by the system voltage end and the reference voltage end of the power supply circuit. The shift register series has a plurality of shift registers series-connected to one another, and an output end of each of the shift registers is one-on-one coupled to the one of the gate lines. A first end of each of the first transistors is one-on-one coupled to one of the output ends of the shift registers respectively. A second end of each of the first transistors is coupled to the system voltage end of the reference voltage end of the power supply circuit. A first end of the capacitor is coupled to a control end of each of the first transistors. A second end of the capacitor is coupled to the reference voltage end of the power supply circuit.

One embodiment of the present invention provides a shift register series including a plurality of first transistors, a plurality of capacitors and a plurality of shift registers. A first end of each of the capacitors is coupled to a control end of each of the first transistors. A second end of each of the capacitors is coupled to a reference voltage. The shift registers are series-connected to one another. An output end of each of the shift registers is one-on-one coupled to the first end of each of the first transistors respectively. The nth shift register among the shift registers comprises a second transistor, a third transistor and a fourth transistor. A first end of the second transistor is coupled to a system voltage, a control end of the second transistor is coupled to an output end of the (n−1)th shift register among the shift registers. A first end of the third transistor is coupled to the second end of the second transistor. A second end of the third transistor is coupled to the reference voltage. A control end of the third transistor is coupled to the (n+2)th shift register among the shift registers. A first end of the fourth transistor receives a clock. A second end of the fourth transistor is coupled to an input end of the (n+1)th shift register among the shift registers. A control end of the fourth transistor is coupled to the second end of the second transistor.

On embodiment of the present invention provides a method for releasing an image retention on a display panel. A gate line of the display panel is driven by a shift register. The aforementioned method comprises configuring a first transistor, wherein a first end of the first transistor is coupled to an output end of the shift register, and a second end of the first transistor is coupled to a system voltage or a reference voltage; configuring a capacitor, wherein a first end the capacitor is coupled to a control end of the first transistor, and a second end of the capacitor is coupled to a reference voltage; and pulling up the reference voltage during a power-off period.

Accordingly, the power supply circuit pulls up the voltage of the reference voltage end during the power-off period so that the first transistors are turned on. Therefore, the first transistors can pull up the voltages of all gate lines. Thus, the problem of image retention of the shift register, which is made of amorphous silicon, during the power-off period can be overcome.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
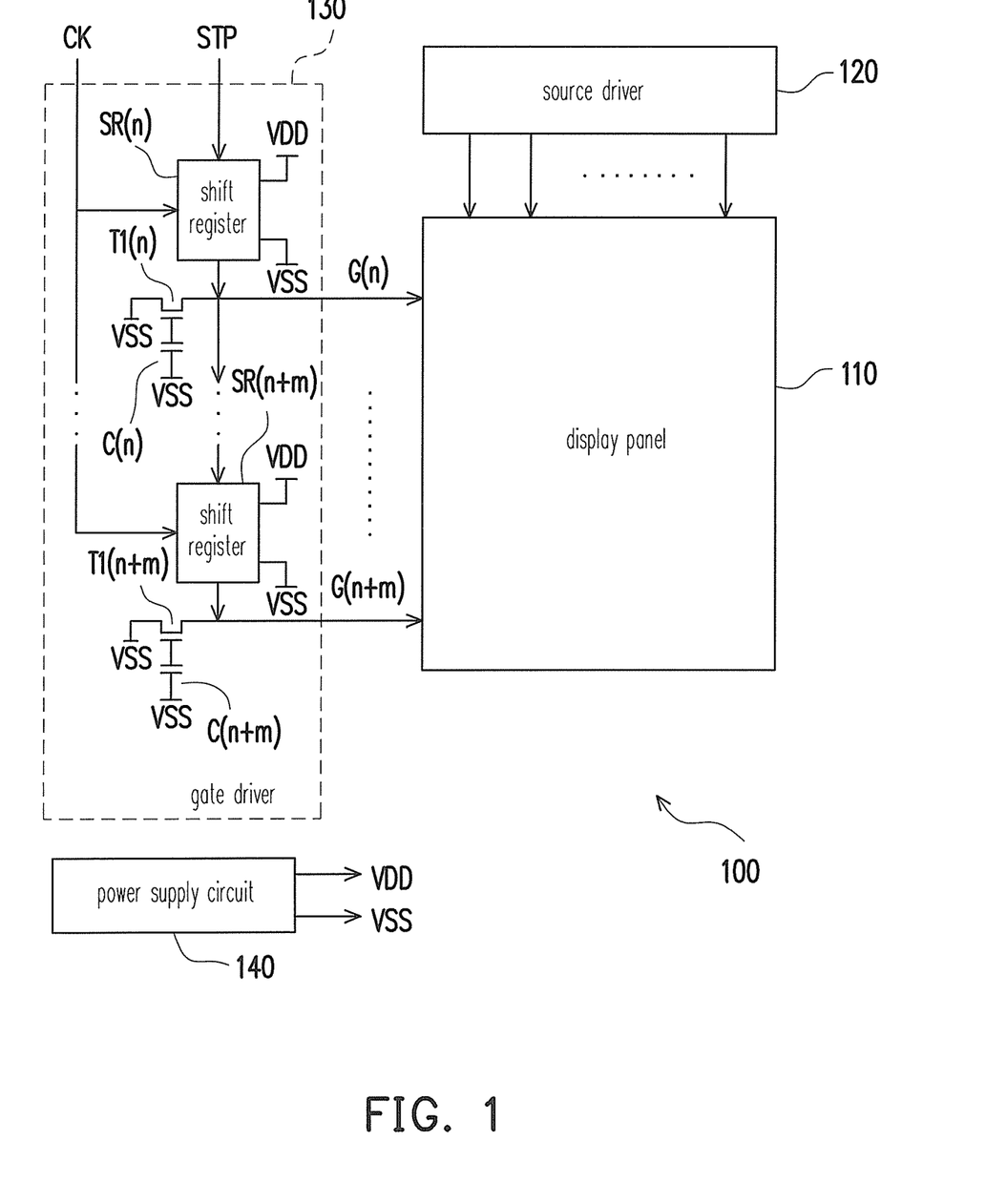
FIG. 1 is a circuit block diagram of a flat panel display according to one embodiment of the invention.

FIG. 1 is a circuit block diagram of a flat panel display according to one embodiment of the invention. As shown in FIG. 1, a flat panel display 100 comprises a display panel 110, a source driver 120, a gate driver 130 and a power supply circuit 140. During the normal operation period NOP, a system voltage end of the power supply circuit 140 stably supplies a system voltage VDD with a high voltage level Vgh and a reference voltage end of the power supply circuit 140 stably supplies a reference voltage VSS (such as a ground voltage or negative voltage) with a low voltage level Vgl to provide the required operation electrical energy to every internal components (such as gate driver 130) of the flat panel display 100.

The display panel 110 has a plurality of gate lines (not shown). The gate driver 130 has a plurality of shift registers, a plurality of first transistors and a plurality of capacitors. As shown in FIG. 1, the shift registers SR(n) and SR(n+m) represent a lot of shift registers, and the transistors T1(n) and T1(n+m) represent a lot of first transistors. In the present embodiment, the transistors T1(n)~T1(n+m) are N-channel metal oxide semiconductor (NMOS) transistors.

In FIG. 1, the capacitors C(n) and C(n+m) represent a lot of capacitors. Although several capacitors C(n)~C(n+m) are drawn in FIG. 1, the capacitors C(n)~C(n+m) can be replaced by a single capacitor. That is, the first end of the single capacitor is coupled to the control ends of the transistors T1(n)~T1(n+m), and the second end of the single capacitor is coupled to the reference voltage VSS of the power supply circuit 140, the performance of the single capacitor is as same as that of the capacitors C(n)~C(n+m).

The shift registers SR(n)~SR(n+m) can be implemented by any possible methods according to the designing demand while the present embodiment is applied. For instance, each of the shift registers SR(n)~SR(n+m) can be a flip-flop or a latch. The shift registers SR(n)~SR(n+m) are series-connected to one another to form a shift register series, which is powered by the system voltage VDD and the reference voltage VSS of the power supply circuit 140. Output ends G(n)~G(n+m) of the shift registers SR(n)~SR(n+m) are one-on-one coupled to the gate lines (not shown) of the display panel 110 respectively. The first ends of the first transistors T1(n)~T1(n+m) are one-one-one coupled to the output ends of the shift registers SR(n)~SR(n+m) respectively. Second ends of the first transistors T1(n)~T1(n+m) are coupled to the reference voltage VSS of the power supply circuit 140.

Figure 2:
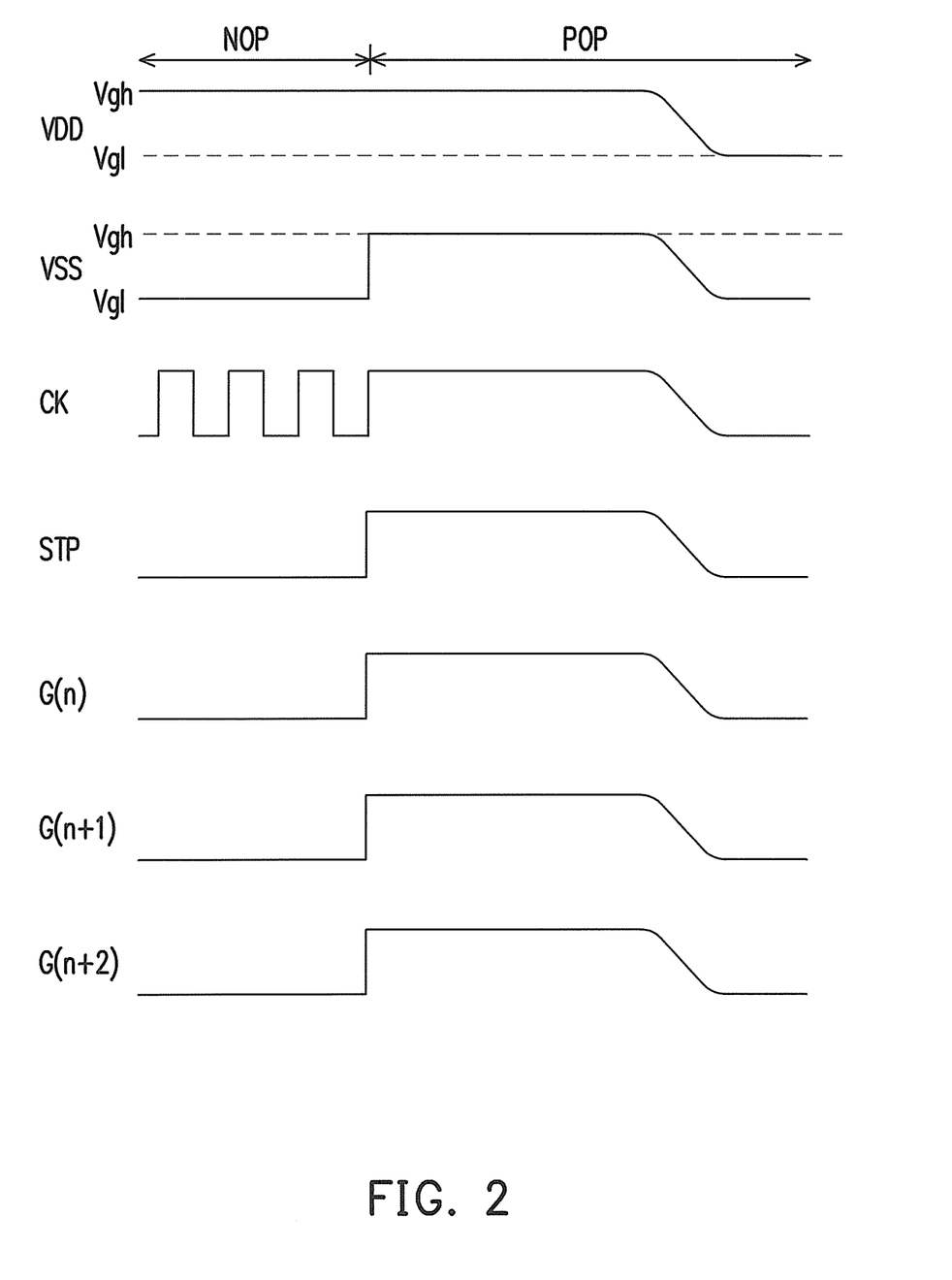
FIG. 2 is a schematic diagram showing waveform variations of voltages in FIG. 1 according to one embodiment of the present invention.

FIG. 2 is a schematic diagram showing waveform variations of voltages in FIG. 1 according to one embodiment of the present invention. As shown in FIG. 1 and FIG. 2, during the normal operation period NOP, the power supply circuit 140 stably provides the system voltage VDD with the high voltage level Vgh, and stably provides the reference voltage VSS with the low voltage level Vgl. During the early stage of the power-off period POP, the power supply circuit 140 briefly pulls up the reference voltage VSS of the reference voltage end until the system voltage VDD of the system voltage end of the power supply circuit 140 drops and the reference voltage VSS drops accordingly. In addition, designers may determines the upper limit of the pulled voltage level of the reference voltage VSS during the power-off period POP based on the design requirement. In the present embodiment, during the power-off period POP, the power supply circuit 140 pulls up the reference voltage VSS of the reference voltage end to be equal to the system voltage VDD (i.e. the high voltage level Vgh). After the electrical energy stored in the power supply circuit 140 is discharged, the system voltage VDD and the reference voltage drop accordingly.

During the reference voltage VSS is pulled up, the gate clock CK and the vertical start pulse STP are also simultaneously pulled up. While the reference voltage VSS is pulled up, the voltages of the control ends of the first transistors T1(n)~T1(n+m) are pulled up accordingly through being coupled to the capacitors C(n)~C(n+m). When the voltages of the control ends of the first transistors T1(n)~T1(n+m) are pulled up to the threshold voltage, the first transistors T1(n)~T1(n+m) are turned on so that the reference voltage VSS which has been pulled up to the high voltage level Vgh is transmitted to the shift registers SR(n)~SR(n+m) through the output ends G(n)~G(n+m) of the first transistors T1(n)~T1(n+m) and even transmitted to all of the gate lines of the display panel 110. Therefore, the gate driver 130 can pull up the voltages of all of the gate lines of the display panel 110 during the power-off period so that the thin film transistors (TFT, not shown) of all of the pixels of the display panel 110 are turned on. Thus, the voltage stored in each of the pixel can be effectively discharged before the pixels are powered off. Thus, the problem of image retention of the shift register, which is made of amorphous silicon, during the power-off period can be overcome.

Figure 5:
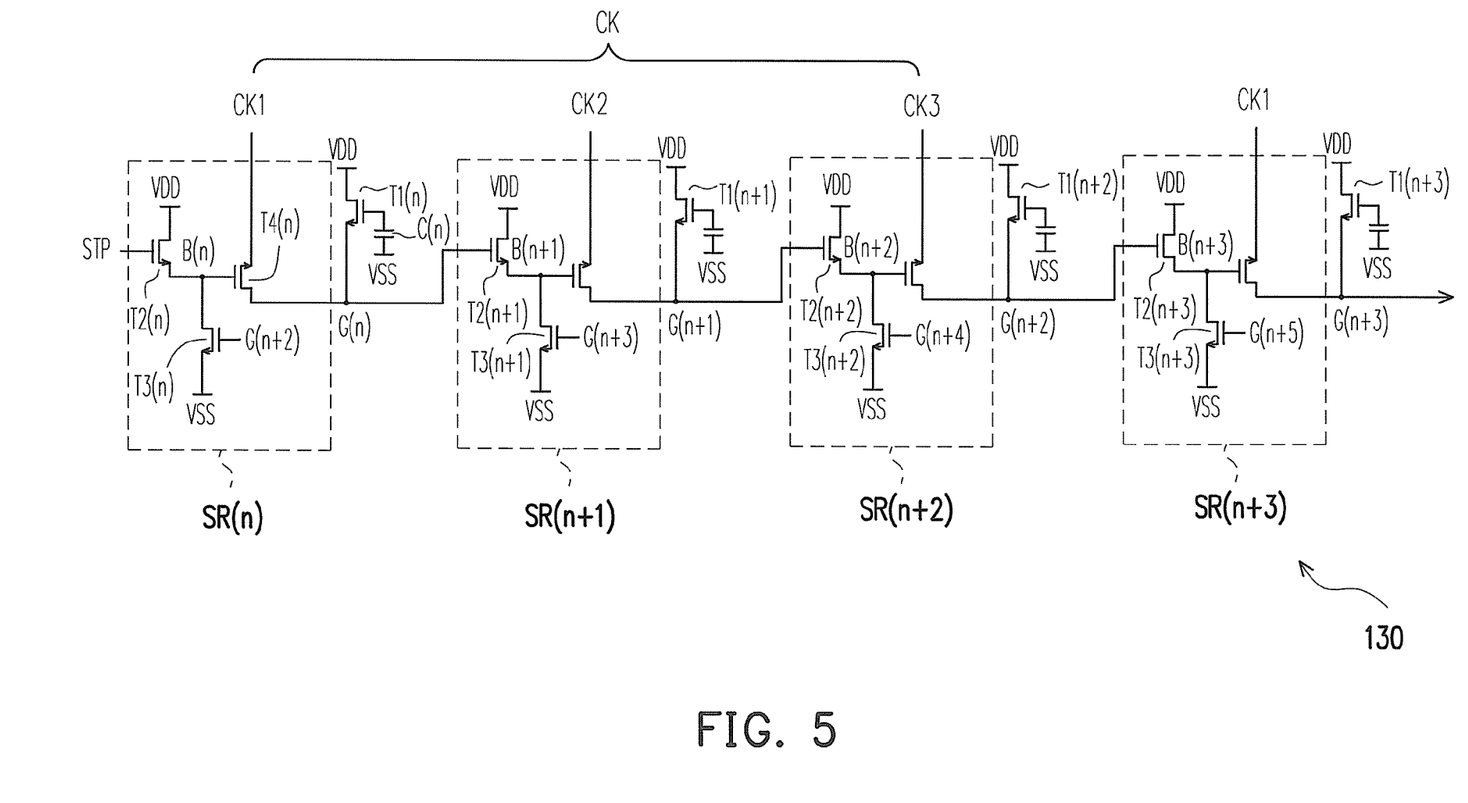
FIG. 5 is a circuit diagram of the shift register in the gate driver in FIG. 1 according to another embodiment of the present invention.

The second ends of the aforementioned first transistors T1(n)~T1(n+m) can be coupled to the reference voltage VSS of the power supply circuit 140. However, the present embodiment is not limited thereto. For instance, in other embodiments, the second ends of the first transistors T1(n)~T1(n+m) can be coupled to the system voltage VDD of the power supply circuit 140 (as shown in FIG. 5).

The shift registers SR(n)~SR(n+m) can be implemented in the same method. The nth shift register SR(n) among the shift registers SR(n)~SR(n+m) is taken as a description exemplar, and the other shift registers can be implemented by referring to the description of the nth shift register SR(n).

Figure 3:
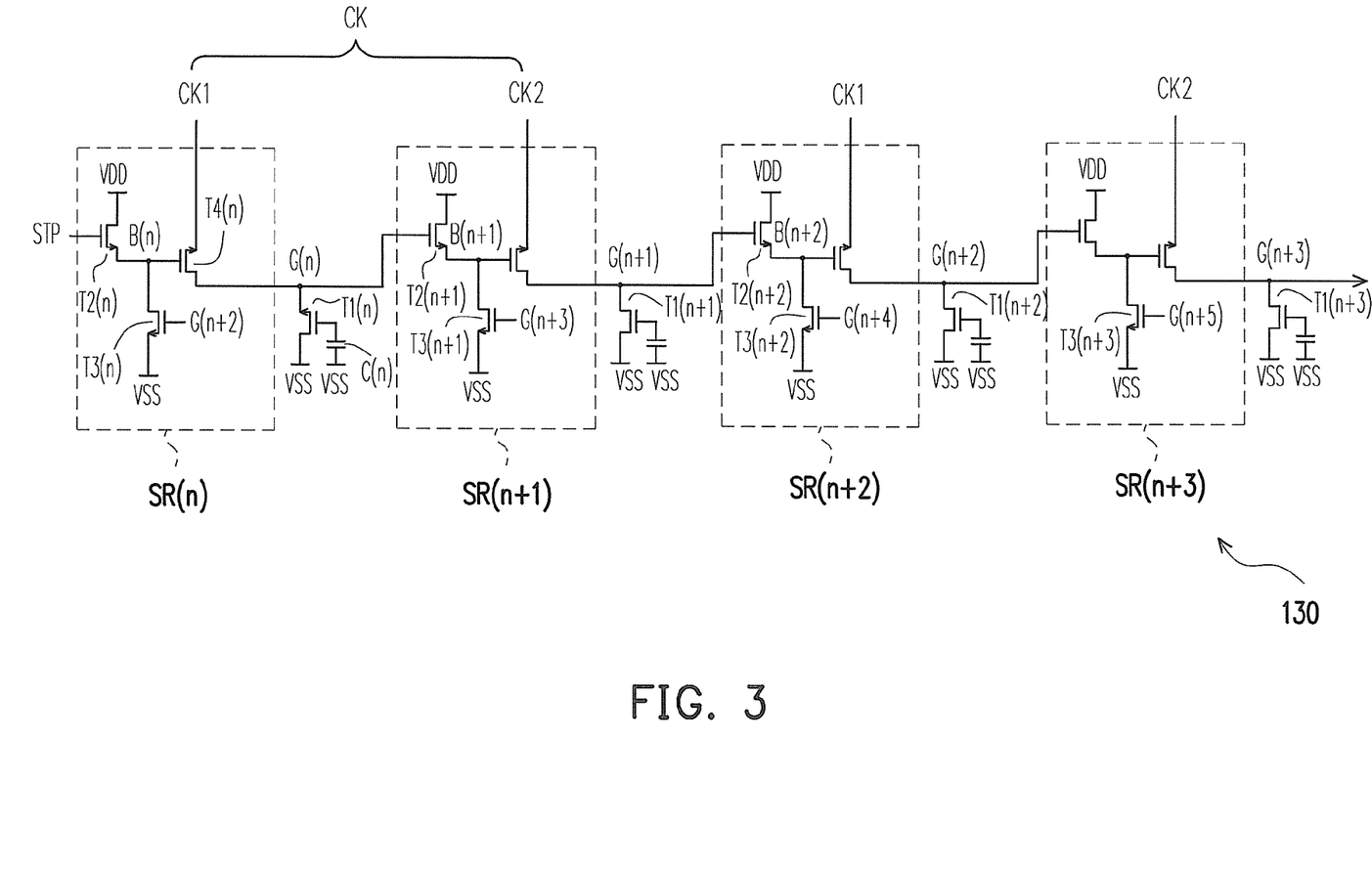
FIG. 3 is a circuit diagram of the shift register in the gate driver in FIG. 1 according to one embodiment of the present invention.

FIG. 3 is a circuit diagram of the shift registers SR(n)~SR(n+m) in the gate driver 130 in FIG. 1 according to one embodiment of the present invention. The nth shift register SR(n) includes a second transistor T2(n), a third transistor T3(n) and a fourth transistor T4(n). In the present embodiment, the transistor T2(n), T3(n) and T4(n) are NMOS transistors. The control end of the second transistor T2(n) can be coupled to the output end of the (n−1)th shift register among the shift registers SR(n)~SR(n+m) (i.e. the output end of the preceding order shift register). If the shift register SR(n) is the first order shift register in the shift register series, the control end of the second transistor T2(n) can receive the vertical start pulse STP. The first terminal of the second transistor T2(n) is coupled to the system voltage VDD. In other embodiments, the first terminal of the second transistor T2(n) is coupled to the output end of the preceding order shift register SR(n–1) (or the vertical start pulse STP).

The first end of the third transistor T3($n$) of the nth shift register SR(n) is coupled to the second end of the second transistor T2($n$). The second end of the third transistor T3($n$) receives the reference voltage VSS supplied by the power supply circuit 140, and the control end of the third transistor T3($n$) is coupled to the output end of shift register two orders subsequent to the shift register SR(n), which is the output end G(n+2) of the (n+2)th shift register SR(n+2) among the shift registers SR(n)~SR(n+m). In other embodiment, the control end of the third transistor T3($n$) of the nth shift register SR(n) is coupled to the second end of the second transistor T2($n$+2) of the (n+2)th shift register SR(n+2) to receive the internal voltage B(n+2) of the shift register SR(n+2).

The control end of the fourth transistor T4($n$) of the nth shift register SR(n) is coupled the second end of the second transistor T2($n$) to receive the internal voltage B(n) of the shift register SR(n). The second of the fourth transistor T4($n$) is coupled to the output end of the successive order shift register, which is the output end of the (n+1)th shift register SR(n+1) among the shift registers SR(n)~SR(n+m). The first end of the fourth transistor T4($n$) receives the clock CK. In the present embodiment, the clock CK comprises a first clock CK1 and a second CK2, and the first clock CK1 is the reversed phase of the second clock CK2 (as shown in FIG. 4).

Figure 4:
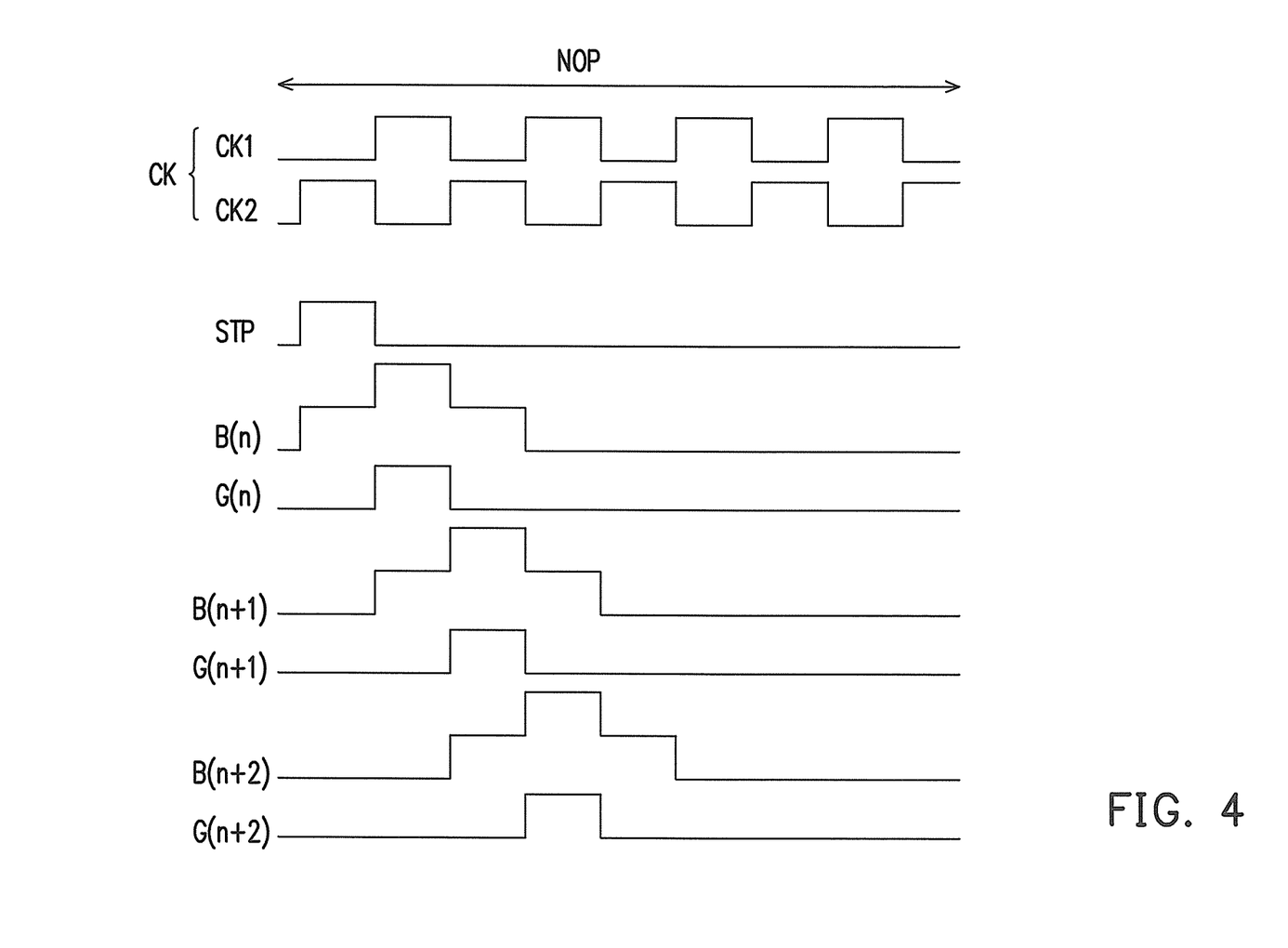
FIG. 4 is a schematic diagram showing waveform variations of voltages in FIG. 3 according to one embodiment of the present invention.

FIG. 4 is a schematic diagram showing waveform variations of voltages in FIG. 3 according to one embodiment of the present invention. As shown in FIG. 3 and FIG. 4, the first clock 1 is provided to the shift registers SR(n), SR(n+2) and so on, and the second clock CK2 is provided to the shift registers S(n+1), S(n+3) and so on. During the normal operation period NOP, when the vertical start pulse STP is transmitted to the control end of the second transistor T2($n$), the second transistor T2($n$) is turned on so that the internal voltage B(n) of the shift register SR(n) is pulled up to a voltage level close to the voltage level of the system voltage. Meanwhile, the internal voltage B(n) is stored in the parasitic capacitance of the shift register SR(n). With the increasing of the internal voltage B(n), the fourth transistor T4($n$) will be turned on. When the vertical start pulse is ended, the second transistor T2($n$) is turned off but the parasitic capacitance of the shift register SR(n) holds the internal voltage B(n) at the high voltage level Vgh. Therefore, the fourth transistor T4($n$) remains in a turned-on state.

The pulse of the first clock CK1 is transmitted to the first end of the fourth transistor T4($n$), and the pulse pulls up the internal voltage B(n) to be close to twice of the voltage level of the system voltage VDD (i.e. 1VDD) through the coupling effect induced by the parasitic capacitance between the gate and the source of the fourth transistor T4($n$). Meanwhile, since the fourth transistor T4($n$) is turned on, the pulse of the first clock CK1 is transmitted through the fourth transistor T4($n$) and the output end G(n) of the shift register SR(n) and outputted to the successive order shift register SR(n+1).

The aforementioned operating process of the shift register SR(n) is applied to all of the other shift registers SR(n+1)~SR(n+m). When the output end G(n+2) of the (n+2)th shift register SR(n+2) outputs the pulse, the pulse is transmitted to not only the corresponding gate line of the display panel 110, but also the control end of the third transistor T3($n$) of the shift register SR(n). When the voltage of the output end G(n+2) of the shift register SR(n+2) is pulled up, the third transistor T3($n$) is turned on so that the internal voltage of the shift register SR(n) is pulled up to being closed to the voltage level of the reference voltage VSS. Hence, the fourth transistor T4($n$) is turned off. The operating process of the third transistor T3($n$) can be applied on the other third transistors T3($n$+1)~T3($n$+3) of all of the shift registers SR(n+1)~SR(n+3) and is not described herein.

Those who use the above-described embodiment can freely change the present embodiment based on the requirements of design. FIG. 5 is a circuit diagram of the shift registers SR(n)~SR(n+3) in the gate driver 130 in FIG. 1 according to one embodiment of the present invention. The embodiment shown in FIG. 5 and the embodiment shown in FIG. 3 are similar to each other and the difference therebetween is the second ends of the first transistors T1($n$)~T1($n$+3) are coupled to the system voltage of the power supply circuit 140 in FIG. 5. During the power-off period POP, the power supply circuit pulls up the reference voltage VSS so that the first transistors T1($n$)~T1($n$+3) are turned on. Therefore, during the power-off period POP, the system voltage VDD is transmitted to the output ends G(n)~G(n+3) of the shift register SR(n) through the first transistors T1($n$)~T1($n$+3) and even to the gate lines of the display panel 110. Thus, the problem of the image retention of the display panel 110 can be solved.

Figure 6:
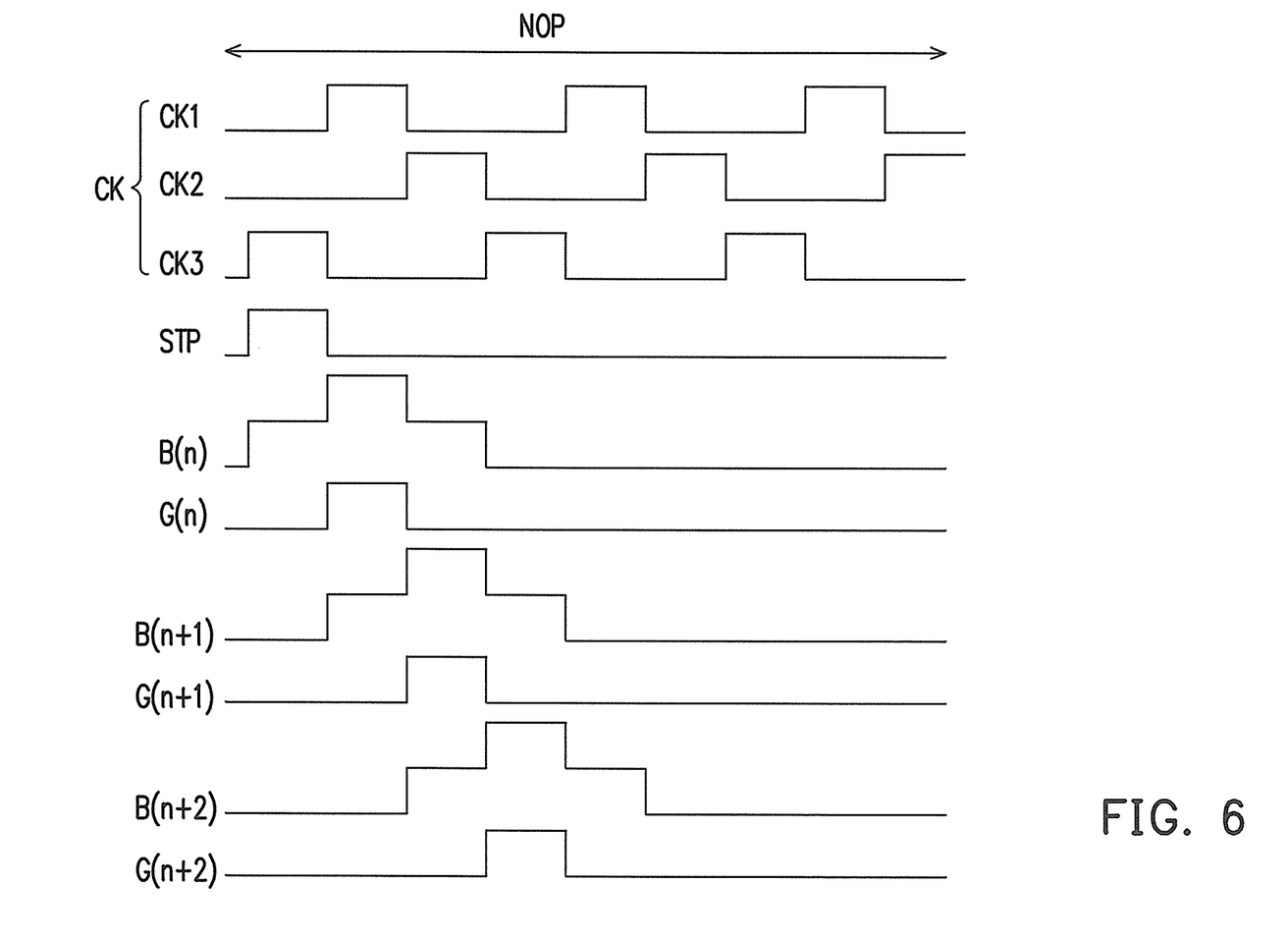
FIG. 6 is a schematic diagram showing waveform variations of voltages in FIG. 5 according to one embodiment of the present invention.

Another difference between the embodiments shown in FIG. 5 and FIG. 3 respectively, in FIG. 5, the clock comprises the first clock CK1, the second clock CK2 and the third clock CK3, as shown in FIG. 6. FIG. 6 is a schematic diagram showing waveform variations of voltages in FIG. 5 according to one embodiment of the present invention. As shown in FIG. 5 and FIG. 6, the first clock 1 is provided to the shift registers SR(n), SR(n+3) and so on, and the second clock CK2 is provided to the shift registers S(n+1) and so on, and the third clock CK3 is provided to the shift registers S(n+2) and so on. The operating processes of the shift registers SR(n)~SR(n+3) shown in FIG. 5 are similar to those of the shift registers SR(n)~SR(n+3) shown in FIG. 3 and are not described herein.

Figure 7:
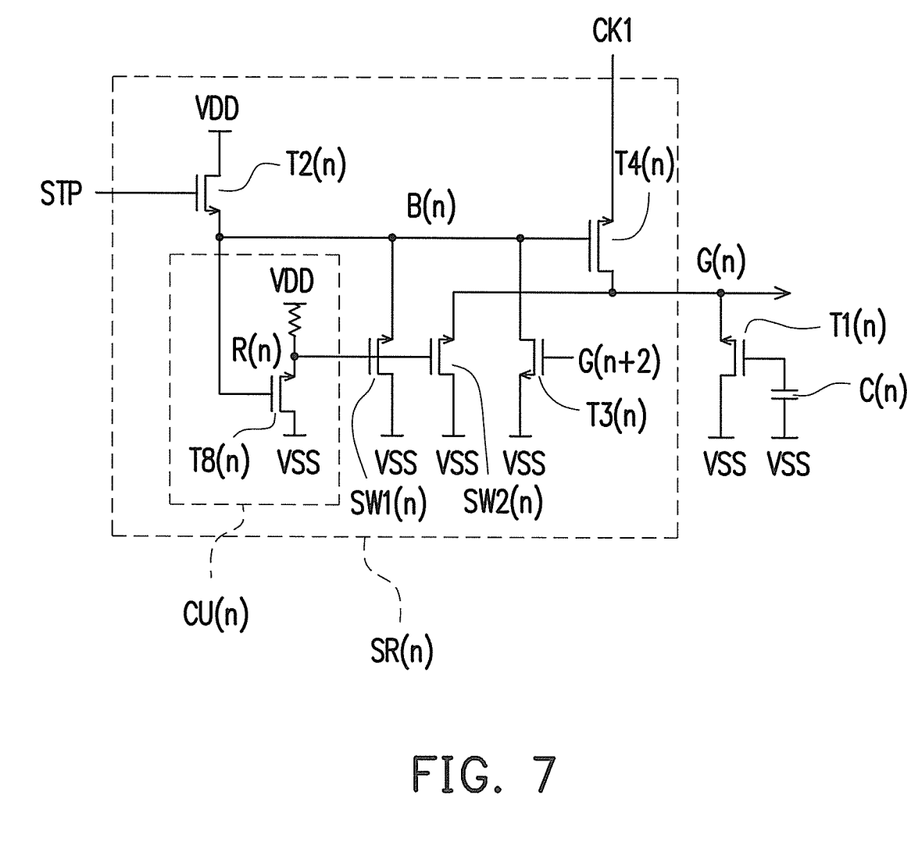
FIG. 7 is a circuit diagram of the shift register in the gate driver in FIG. 1 according to another embodiment of the present invention.

FIG. 7 is a circuit diagram of the shift register SR(n) in the gate driver 130 in FIG. 1 according to another embodiment of the present invention, and the implementations of the other shift registers can be referred to the related descriptions of the shift register SR(n). The shift register SR(n) shown in FIG. 7 and the shift register SR(n) shown in FIG. 3 are similar to each other and the similarity therebetween is not described herein. The difference between the shift register SR(n) shown in FIG. 7 and the shift register SR(n) shown in FIG. 3 is that the shift register SR(n) in FIG. 7 further comprises a first pull-down switch SW1($n$), a second pull-down switch SW2($n$) and a switch controlling unit CU(n). The two ends of the first pull-down switch SW1($n$) are coupled to the second end of the second transistor T2($n$) and the reference voltage VSS of the power supply circuit 140 respectively. The two ends of the second pull-down switch SW2($n$) are coupled to the second end of the fourth transistor T4($n$) and the reference voltage VSS of the power supply circuit respectively 140. The controlling unit CU(n) controls the first pull-down switch SW1 ($n$) and the second pull-down switch SW2($n$). When the second end of the second transistor T2($n$) is at the logic-high level, the switch controlling unit CU(n) turns off the first pull-down switch SW1($n$) and the second pull-down switch SW2($n$) or turns on the first pull-down switch SW1($n$) and the second pull-down switch SW2($n$). Hence, when the switch controlling unit CU(n) detects the internal voltage B(n) is at the logic-low level, the switch controlling unit CU(n) ensures the fourth transistor T4($n$) at the turnoff state by turning on the first pull-down switch SW1($n$). Furthermore, while the switch controlling unit CU(n) ensures the internal voltage B(n) at the logic-low level by turning on the second pull-down switch SW2($n$), the voltage of the output end G(n) of the shift register SR(n) is pulled down to being close to the voltage level of the reference voltage VSS.

The implementation of the switch controlling unit CU(n) can be varied according to the designing demand while the present embodiment is applied. For instance, the switch controlling unit CU(n) can comprises a pull-up resistor R(n) and an eighth transistor T8(*n*). The first end of the pull-up resistor R(n) is coupled to the system voltage VDD, and the second end of the pull-up resistor R(n) is coupled to the control ends of the first pull-down switch SW1(*n*) and the second pull-down switch SW2(*n*) respectively. The control end of the eighth transistor T8(*n*) is coupled to the second end of the second transistor T2(*n*). The first end of the eighth transistor T8(*n*) is coupled to the control ends of the first pull-down switch SW1(*n*) and the second pull-down switch SW2(*n*), and the second end of the eighth transistor T8(*n*) is coupled to the reference voltage end of the power supply circuit 140 to receive the reference voltage VSS.

Figure 8:
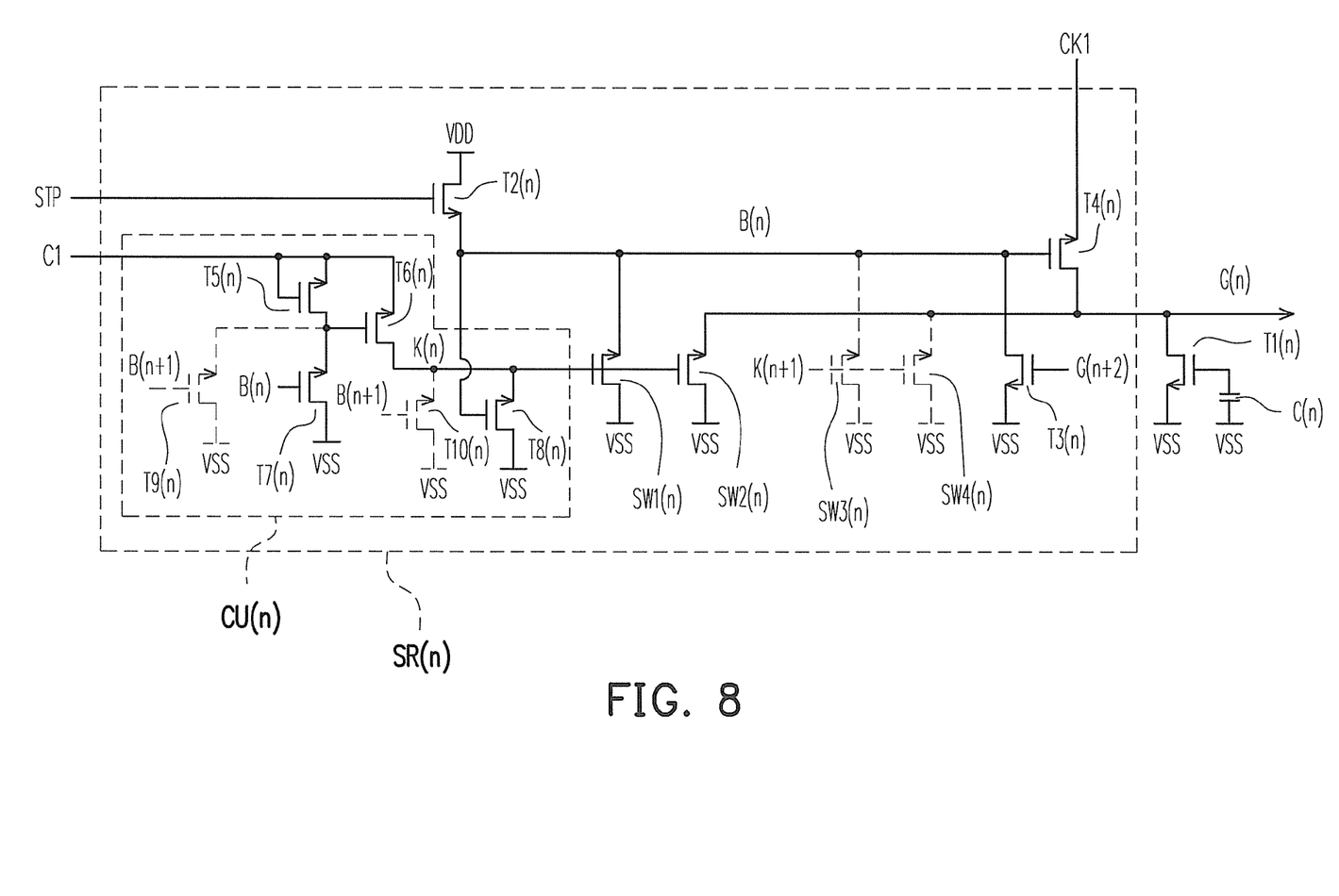
FIG. 8 is a circuit diagram of the shift register in FIG. 1 according to the other embodiment of the present invention.

FIG. 8 is a circuit diagram of the shift register SR(n) in FIG. 1 according to the other embodiment of the present invention. The embodiment shown in FIG. 8 and the embodiment shown in FIG. 7 are similar to each other and the difference them is the switch controlling unit CU(n) further comprises a fifth transistor T5(*n*), a sixth transistor T6(*n*) and a seventh transistor T7(*n*) in the embodiment shown in FIG. 8. The first end of the fifth transistor T5(*n*) and the control end of the fifth transistor T5(*n*) receive a controlling signal C1. The first end of the sixth transistor T5(*n*) receives the controlling signal C1. The control end of the sixth transistor T6(*n*) is coupled to the second end of the fifth transistor T5(*n*), and the second end of the sixth transistor T6(*n*) is coupled to the control ends of the first pull-down switch SW1(*n*) and the second pull-down switch SW2(*n*) respectively so as to control the first pull-down switch SW1(*n*) and the second pull-down switch SW2(*n*). The first end and the second end of the seventh transistors T7(*n*) are coupled to the second end of the fifth transistor T5(*n*) and the reference voltage end of the power supply circuit 140 respectively. The control end of the seventh transistor T7(*n*) is coupled to the second end of the second transistor T2(*n*) to receive the internal voltage B(n).

The controlling signal C1 can be provided by the external controller to determine whether the switch controlling unit CU(n) can be enabled. People who implement the present embodiment can determines when to enable the switch controlling unit CU(n) according to the designing demand. For instance, during 100 consecutive frames, the switch controlling unit CU(n) is enabled and then, during the following 100 consecutive frames, the switch controlling unit CU(n) is disabled. Similarly, the external controller can repeatedly alternatively enables and disables the switch controlling unit CU(n) through the controlling signal C1.

When the controlling signal C1 is at the logic-high level and the internal voltage B(n) is at the logic-low level, the fifth transistor T5(*n*) and the sixth transistor T6(*n*) are turned on and the seventh transistor T7(*n*) and the eighth transistor T8(*n*) are turned off. Thus, the first pull-down switch SW1(*n*) and the second pull-down switch SW2(*n*) are turned on by the controlling signal C1 so that the internal voltage B(n) and the voltage of the output end G(n) of the shift register SR(n) are pulled down to being close to the voltage level of the reference voltage VSS. When the controlling signal C1 and the internal voltage B(n) are at the logic-high levels, the fifth transistor T5(*n*), the seventh transistor T7(*n*) and the eighth transistor T8(*n*) are turned on and the sixth transistor T6(*n*) is turned off. Hence, the voltages of the control ends of the first pull-down switch SW1(*n*) and the second pull-down switch SW2(*n*) are pull low so that the first pull-down switch SW1(*n*) and the second pull-down switch SW2(*n*) are turned off.

When the controlling signal C1 is at the logic-low level, no matter what voltage level the internal voltage B(n) is, the switch controlling unit CU(n) cannot turn on the first pull-down switch SW1(*n*) and the second pull-down switch SW2(*n*) because the output end K(n) of the switch controlling unit CU(n) lacks the electrical energy for pulling high the voltage level of the control ends of the first pull-down switch SW1(*n*) and the second pull-down switch SW2(*n*).

The implementation of the switch controlling unit CU(n) shown in FIG. 8 can be varied according to the designing demand while the present embodiment is applied. For instance, a ninth transistor T9(*n*) and a tenth transistor T10(*n*) are added into the switch controlling unit CU(n). The first end and the second end of the ninth transistors T9(*n*) are coupled to the second end of the fifth transistor T5(*n*) and the reference voltage end of the power supply circuit 140 respectively. The first end and the second end of the tenth transistors T10(*n*) are coupled to the second end of the sixth transistor T6(*n*) and the reference voltage end of the power supply circuit 140 respectively. The control ends of the ninth transistor T9(*n*) and the tenth transistor T10(*n*) of the nth shift register SR(n) are coupled the second end of the second transistor T2(*n*+1) of the successive order shift register (which is the (n+1)th shift register SR(n+1)) to receive the internal voltage B(n+1) of the shift register SR(n+1).

Further, for instance, a third pull-down switch SW3(*n*) and a fourth pull-down switch SW4(*n*) are added in the shift register SR(n). Two ends of the third pull-down switch SW3(*n*) are coupled to the second end of the second transistor T2(*n*) and the reference voltage end of the power supply circuit respectively 140 respectively. Two ends of the fourth pull-down switch SW4(*n*) are coupled to the second end of the fourth transistor T4(*n*) and the reference voltage end of the power supply circuit respectively 140 respectively. The third pull-down switch SW3(*n*) and the fourth pull-down switch SW4(*n*) are controlled by the output end K(n+1) of the switch controlling unit CU(n+1) in the (n+1)th shift register SR(n+1).

An embodiment of method for releasing an image retention on the display panel 110 is described the following. The method for releasing an image retention comprises configuring a first transistor T1(*n*) and a capacitor C(n). A first end of the first transistor T1(*n*) is coupled to an output end G(n) of a shift register SR(n). A second end of the first transistor T1(*n*) is coupled to a system voltage VDD or a reference voltage VSS (such as a ground voltage or a negative voltage). A first end of the capacitor C(n) is coupled to a control end of the first transistor T1(*n*). A second end of the capacitor C(n) is coupled to the reference voltage VSS. The reference voltage VSS is pulled up, for example, to a voltage level as same as the system voltage during a power-off period until the stored electrical energy in the power supply circuit 140 is discharged thoroughly.

Accordingly, in the aforementioned embodiments, the power supply circuit 140 pulls up the voltage VSS of the reference voltage end during the power-off period POP so that the first transistor T1(*n*) is turned on. Hence, the first transistor T1(*n*) can pull up the voltage of the corresponding gate line of the display 110 during the power-off period to discharge the storage voltage of the pixels on the gate line. With the same principle, other first transistors T1(*n*+1)~T1(*n*+m) are also turned on to further discharge the storage voltage of the pixels on the corresponding gate lines. Therefore, by applying the aforementioned embodiments, the problem of the image retention of the shift registers made of the amorphous silicon during the power-off period can be overcome.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A flat panel display, comprising:
a display panel having a plurality of gate lines;
a power supply circuit having a system voltage end and a reference voltage end, wherein the power supply circuit pulls up a voltage of the reference voltage end during a power-off period;
a shift register series powered by the system voltage end and the reference voltage end of the power supply circuit, wherein the shift register series has a plurality of shift registers series-connected to one another, and an output end of each of the shift registers is one-on-one coupled to the one of the gate lines;
a plurality of first transistors, wherein a first end of each of the first transistors is one-on-one coupled to one of the output ends of the shift registers respectively, and a second end of each of the first transistors is coupled to the power supply circuit; and
a capacitor, wherein a first end of the capacitor is coupled to a control end of each of the first transistors, and a second end of the capacitor is coupled to the reference voltage end of the power supply circuit.

2. The flat panel display of claim 1, wherein the reference voltage end provides a ground voltage.

3. The flat panel display of claim 1, wherein, during the power-off period, the power supply circuit pulls the voltage of the reference voltage end up to a system voltage.

4. The flat panel display of claim 1, wherein the second end of each of the first transistors is coupled to the reference voltage end of the power supply circuit.

5. The flat panel display of claim 1, wherein the second end of each of the first transistors is coupled to the system voltage end of the power supply circuit.

6. The flat panel display of claim 1, wherein each of the shift registers includes a flip-flop or a latch.

7. The flat panel display of claim 1, wherein the nth shift register among the shift registers comprises:
a second transistor, wherein a control end of the second transistor is coupled to an output end of the (n−1)th shift register among the shift registers;
a third transistor, wherein a first end of the third transistor is coupled to a second end of the second transistor, and a second end of the third transistor is coupled to the reference voltage end of the power supply circuit, and a control end of the third transistor is coupled to the (n+2)th shift register among the shift registers; and
a fourth transistor, wherein a first end of the fourth transistor receives a clock, and a second end of the fourth transistor is coupled to an input end of the (n+1)th shift register among the shift registers, and a control end of the fourth transistor is coupled to the second end of the second transistor.

8. The flat panel display of claim 7, wherein the control end of the third transistor of the nth shift register among the shift registers is coupled to an output end of the (n+2)th shift register among the shift registers.

9. The flat panel display of claim 7, wherein the control end of the third transistor of the nth shift register among the shift registers is coupled to a second end of a second transistor in the (n+2)th shift register among the shift registers.

10. The flat panel display of claim 7, wherein the nth shift register among the shift registers further comprises:
a first pull-down switch, wherein two ends of the first pull-down switch are coupled to the second end of the second transistor and the reference voltage end of the power supply circuit respectively;
a second pull-down switch, wherein two ends of the second pull-down switch are coupled to the second end of the fourth transistor and the reference voltage end of the power supply circuit respectively; and
a switch controlling unit controlling the first pull-down switch and the second pull-down switch, wherein when a voltage level of the second end of the second transistor is a logic-high level, the switch controlling unit turns off the first pull-down switch and the second pull-down switch, but otherwise turn on the first pull-down switch and the second pull-down switch.

11. The flat panel display of claim 10, wherein the switch controlling unit comprises:
a fifth transistor, wherein a first end of the fifth transistor and a control end of the fifth transistor receive a controlling signal;
a sixth transistor, wherein a first end of the sixth transistor receives the controlling signal, and a control end of the sixth transistor is coupled to a second end of the fifth transistor, and a second end of the sixth transistor controls the first pull-down switch and the second pull-down switch;
a seventh transistor, wherein a first end of the seventh transistor and a second end of the seventh transistor are coupled to the second end of the fifth transistor and the reference voltage end of the power supply circuit respectively, and a control end of the seventh transistor is coupled to the second end of the second transistor; and
a eighth transistor, wherein a first end of the eighth transistor and a second end of the eighth transistor are coupled to the second end of the sixth transistor and the reference voltage end of the power supply circuit respectively, and a control end of the eighth transistor is coupled to the second end of the second transistor.

12. The flat panel display of claim 11, wherein the switch controlling unit further comprises:
a ninth transistor, wherein a first end of the ninth transistor and a second end of the ninth transistor are coupled to the second end of the fifth transistor and the reference voltage end of the power supply circuit respectively, and a control end of the ninth transistor is coupled to a second end of a second transistor in the (n+1)th shift register among the shift registers; and
a tenth transistor, wherein a first end of the tenth transistor and a second end of the tenth transistor are coupled to the second end of the sixth transistor and the reference voltage end of the power supply circuit respectively, and a control end of the tenth transistor is coupled to the second end of the second transistor in the (n+1)th shift register among the shift registers.

13. The flat panel display of claim 10, wherein the nth shift register among the shift registers further comprises:
a third pull-down switch, wherein two ends of the third pull-down switch are coupled to the second end of the second transistor and the reference voltage end of the power supply circuit respectively; and
a fourth pull-down switch, wherein two ends of the fourth pull-down switch are coupled to the second end of the fourth transistor and the reference voltage end of the power supply circuit respectively,
wherein the third pull-down switch and the fourth pull-down switch are controlled by a switch controlling unit of the (n+1)th shift register among the shift registers.

14. A shift register series comprising:
a plurality of first transistors;
a plurality of capacitor, wherein a first end of each of the capacitors is coupled to a control end of each of the first transistors, and a second end of each of the capacitors is coupled to a reference voltage; and
a plurality of shift registers series-connected to one another, wherein an output end of each of the shift registers is one-on-one coupled to a first end of each of the first transistors, and the nth shift register among the shift registers comprises:
  a second transistor, wherein a first end of the second transistor is coupled to a system voltage, a control end of the second transistor is coupled to an output end of the (n−1)th shift register among the shift registers;
  a third transistor, wherein a first end of the third transistor is coupled to a second end of the second transistor, and a second end of the third transistor is coupled to the reference voltage, and a control end of the third transistor is coupled to the (n+2)th shift register among the shift registers; and
  a fourth transistor, wherein a first end of the fourth transistor receives a clock, and a second end of the fourth transistor is coupled to an input end of the (n+1)th shift register among the shift registers, and a control end of the fourth transistor is coupled to the second end of the second transistor.

15. The shift register series of claim 14, wherein the reference voltage is a ground voltage.

16. The shift register series of claim 14, wherein the second end of each of the first transistors is coupled to the reference voltage.

17. The shift register series of claim 14, wherein the second end of each of the first transistors is coupled to the system voltage.

18. The shift register series of claim 14, wherein the control end of the third transistor of the nth shift register among the shift registers is coupled to an output end of the (n+2)th shift register among the shift registers.

19. The shift register series of claim 14, wherein the control end of the third transistor of the nth shift register among the shift registers is coupled to a second end of a second transistor of the (n+2)th shift register among the shift registers.

20. The shift register series of claim 14, wherein the nth shift register among the shift registers further comprises:
a first pull-down switch, wherein two ends of the first pull-down switch are coupled to the second end of the second transistor and the reference voltage respectively;
a second pull-down switch, wherein two ends of the second pull-down switch are coupled to the second end of the fourth transistor and the reference voltage respectively; and
a switch controlling unit controlling the first pull-down switch and the second pull-down switch, wherein when a voltage level of the second end of the second transistor is a logic-high level, the switch controlling unit turns off the first pull-down switch and the second pull-down switch, but otherwise turn on the first pull-down switch and the second pull-down switch.

21. The shift register series of claim 20, wherein the switch controlling unit comprises:
a fifth transistor, wherein a first end of the fifth transistor and a control end of the fifth transistor receive a controlling signal;
a sixth transistor, wherein a first end of the sixth transistor receives the controlling signal, and a control end of the sixth transistor is coupled to a second end of the fifth transistor, and a second end of the sixth transistor controls the first pull-down switch and the second pull-down switch;
a seventh transistor, wherein a first end of the seventh transistor and a second end of the seventh transistor are coupled to the second end of the fifth transistor and the reference voltage respectively, and a control end of the seventh transistor is coupled to the second end of the second transistor; and
a eighth transistor, wherein a first end of the eighth transistor and a second end of the eighth transistor are coupled to the second end of the sixth transistor and the reference voltage respectively, and a control end of the eighth transistor is coupled to the second end of the second transistor.

22. The shift register series of claim 21, wherein the switch controlling unit further comprises:
a ninth transistor, wherein a first end of the ninth transistor and a second end of the ninth transistor are coupled to the second end of the fifth transistor and the reference voltage respectively, and a control end of the ninth transistor is coupled to a second end of a second transistor in the (n+1)th shift register among the shift registers; and
a tenth transistor, wherein a first end of the tenth transistor and a second end of the tenth transistor are coupled to the second end of the sixth transistor and the reference voltage respectively, and a control end of the tenth transistor is coupled to the second end of the second transistor in the (n+1)th shift register among the shift registers.

23. The shift register series of claim 20, wherein the nth shift register among the shift registers further comprises:
a third pull-down switch, wherein two ends of the third pull-down switch are coupled to the second end of the second transistor and the reference voltage respectively; and
a fourth pull-down switch, wherein two ends of the fourth pull-down switch are coupled to the second end of the fourth transistor and the reference voltage respectively,
wherein the third pull-down switch and the fourth pull-down switch are controlled by a switch controlling unit of the (n+1)th shift register among the shift registers.

24. A method for releasing an image retention on a display panel, wherein a gate line of the display panel is driven by a shift register, the method comprising:
configuring a first transistor, wherein a first end of the first transistor is coupled to an output end of the shift register, and a second end of the first transistor is coupled to a system voltage or a reference voltage;
configuring a capacitor, wherein a first end the capacitor is coupled to a control end of the first transistor, and a second end of the capacitor is coupled to a reference voltage; and
pulling up the reference voltage during a power-off period.

25. The method of claim 24, wherein the reference voltage is a ground voltage during a non-power-off period.

26. The method of claim 24, wherein the reference voltage is pulled up to the system voltage during a non-power-off period.

* * * * *